(12) United States Patent
Park et al.

(10) Patent No.: US 12,087,547 B2
(45) Date of Patent: Sep. 10, 2024

(54) DEVICE FOR MULTI-LEVEL PULSING, SUBSTRATE PROCESSING APPARATUS INCLUDING THE SAME

(71) Applicant: SEMES Co., Ltd., Chungcheongnam-do (KR)

(72) Inventors: Goon Ho Park, Seoul (KR); Jung Mo Gu, Gyeonggi-do (KR); Ja Myung Gu, Chungcheongnam-do (KR); Hyun Jin Kim, Daegu (KR)

(73) Assignee: SEMES CO. LTD., Chungcheongnam-do (KR)

( * ) Notice: Subject to any disclaimer, the term of this patent is extended or adjusted under 35 U.S.C. 154(b) by 197 days.

(21) Appl. No.: 17/532,082

(22) Filed: Nov. 22, 2021

(65) Prior Publication Data

US 2022/0172927 A1 Jun. 2, 2022

(30) Foreign Application Priority Data

Nov. 27, 2020 (KR) ........................ 10-2020-0161997

(51) Int. Cl.
 *H01J 37/32* (2006.01)

(52) U.S. Cl.
 CPC .. *H01J 37/32183* (2013.01); *H01J 37/32146* (2013.01); *H01J 37/3244* (2013.01)

(58) Field of Classification Search
 CPC ........... H01J 37/32183; H01J 37/32146; H01J 37/3244
 See application file for complete search history.

(56) References Cited

U.S. PATENT DOCUMENTS

| | | | |
|---|---|---|---|
| 10,170,822 B2 | 1/2019 | Solomko et al. | |
| 10,269,540 B1 | 4/2019 | Carter et al. | |
| 2018/0097520 A1* | 4/2018 | Wu | ............... H03K 19/00384 |
| 2018/0294566 A1 | 10/2018 | Wang et al. | |
| 2020/0203130 A1* | 6/2020 | Bhutta | .............. H01L 21/32136 |
| 2022/0216038 A1* | 7/2022 | Wu | ................... H01J 37/32146 |

FOREIGN PATENT DOCUMENTS

| | | | |
|---|---|---|---|
| KR | 100206914 B1 * | 7/1999 | |
| KR | 20170138065 A | 12/2017 | |
| KR | 20190128744 A | 11/2019 | |
| KR | 20200111233 A | 9/2020 | |

* cited by examiner

*Primary Examiner* — Henry Luong
(74) *Attorney, Agent, or Firm* — Buchanan Ingersoll & Rooney PC

(57) ABSTRACT

Provided are an apparatus for multi-level pulsing, which minimizes power reflection when generating plasma using an RF signal having a plurality of pulsing levels, and a substrate processing apparatus including the same. The apparatus includes an RF signal generator for generating an RF signal including a first pulsing level and a second pulsing level that are different from each other, and a matching network for receiving the RF signal and providing a corresponding output signal to a load, wherein the RF signal generator generates the RF signal so that a first target impedance of the first pulsing level and a second target impedance of the second pulsing level are different from each other.

16 Claims, 10 Drawing Sheets

DEVICE FOR MULTI-LEVEL PULSING, SUBSTRATE PROCESSING APPARATUS INCLUDING THE SAME

CROSS REFERENCE TO RELATED APPLICATION

This application claims the benefit of Korean Patent Application No. 10-2020-0161997, Nov. 27, 2020, in the Korean Intellectual Property Office, the disclosure of which is incorporated herein by reference in its entirety.

FIELD OF THE INVENTION

The present invention relates to an apparatus for multi-level pulsing and a substrate processing apparatus including the same.

BACKGROUND OF THE INVENTION

When manufacturing a semiconductor device or a display device, various processes using plasma (e.g., etching, ashing, ion implantation, cleaning, etc.) may be used. A substrate processing apparatus using plasma may be classified into a capacitively coupled plasma (CCP) type and an inductively coupled plasma (ICP) type according to a plasma generation method. In the CCP type, two electrodes are disposed to face each other in a chamber, and an RF signal is applied to one or both of the two electrodes to form an electric field in the chamber to generate plasma. On the other hand, in the ICP type, one or more coils are installed in a chamber, and an RF signal is applied to the coil to induce an electromagnetic field in the chamber to generate plasma.

SUMMARY OF THE INVENTION

On the other hand, to generate the plasma, an RF signal having multiple pulsing levels may be used. For example, in the case of an RF signal having two pulsing levels, power reflection may be minimized by matching a load impedance and a target impedance of the RF signal with respect to one pulsing level. However, it is difficult to match the target impedance and the load impedance with respect to the other pulsing level, so it is difficult to minimize the power reflection. This is because the time taken to adjust the operating parameters (e.g., capacitance) of the components (e.g., capacitor) of the matching circuit is slower than the duration of each pulsing level of the RF signal.

An aspect of the present invention is an apparatus for multi-level pulsing, which minimizes power reflection when generating plasma using an RF signal having a plurality of pulsing levels, and a substrate processing apparatus including the same.

Another aspect of the present invention is a method for minimizing power reflection when generating plasma using an RF signal having multiple pulsing levels.

The problems of the present invention are not limited to the problems mentioned above, and other problems not mentioned will be clearly understood by those skilled in the art from the following description.

One aspect of the apparatus for multi-level pulsing of the present invention for achieving the above object comprises an RF signal generator for generating an RF signal including a first pulsing level and a second pulsing level that are different from each other; and a matching network for receiving the RF signal and providing a corresponding output signal to a load, wherein the RF signal generator generates an RF signal so that a first target impedance of the first pulsing level and a second target impedance of the second pulsing level are different from each other.

One aspect of the substrate processing apparatus of the present invention for achieving the above other object comprises a chamber including a processing space for processing a substrate; a support module located in the processing space and for supporting the substrate; a gas supply unit for supplying gas to the processing space; and a plasma generating unit for exciting gas in the processing space into a plasma state, wherein the plasma generating unit comprises an RF signal generator for generating an RF signal, and a matching network for receiving the RF signal and providing a corresponding output signal to a load, wherein the RF signal generator generates an RF signal so that a first target impedance of a first pulsing level and a second target impedance of a second pulsing level are different from each other.

One aspect of the method for multi-level pulsing of the present invention for achieving the above another object comprises receiving an RF signal of a first pulsing level having a first frequency and a first target impedance, measuring a first load impedance of a load corresponding to the first pulsing level, adjusting operating parameters of tunable components to match the first target impedance and the first load impedance in order to minimize reflected power, receiving an RF signal of a second pulsing level different from the first pulsing level, measuring a second load impedance of the load corresponding to the second pulsing level, and adjusting a second target impedance of the RF signal of the second pulsing level in order to minimize reflected power.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
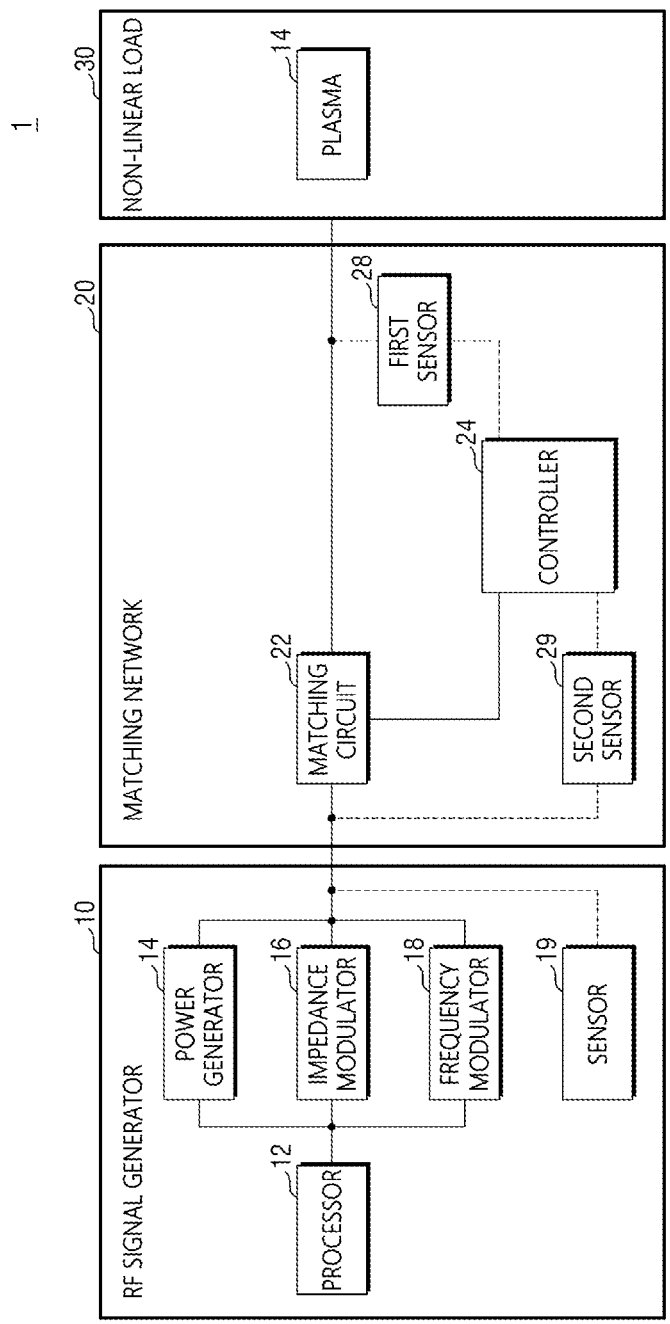
FIG. 1 is a block diagram for describing an apparatus for multi-level pulsing according to an embodiment of the present disclosure.

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided only for making the description of the present invention complete and fully informing those skilled in the art to which the present invention pertains on the scope of the invention, and the present invention is only defined by the scope of the claims. Like reference numerals refer to like elements throughout.

When an element or layer is referred to as being "on" another element or layer, not only located directly on the other element or layer is referred to, but also intervening other layers or elements may be included. On the other hand, when an element is referred to as being "directly on" or "immediately on," it indicates that no intervening element or layer is interposed.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present invention.

The terminology used herein is for the purpose of describing the embodiments and is not intended to limit the present invention. In this specification, the singular also includes the plural unless specifically stated otherwise in the phrase. As used herein, "comprises" and/or "comprising" refers to that a mentioned component, step, operation and/or element does not exclude the presence or addition of one or more other components, steps, operation and/or element.

Figure 2:
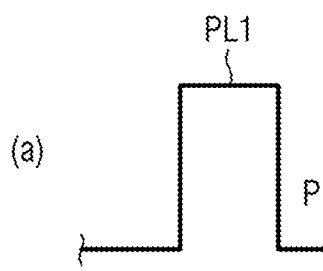
FIG. 2 is a view for describing an RF signal generated by the RF signal generator of FIG. 1.
Figure 2:
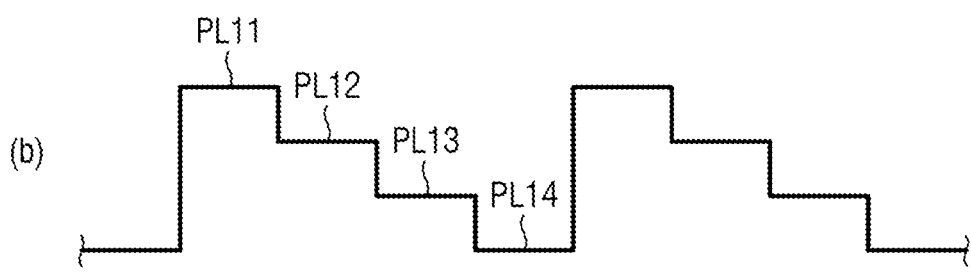
Figure 2:
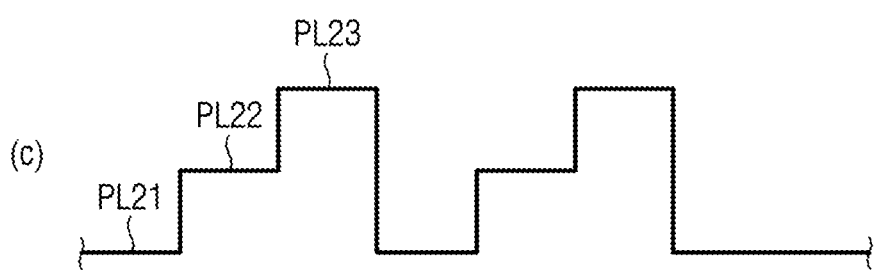
Figure 3:
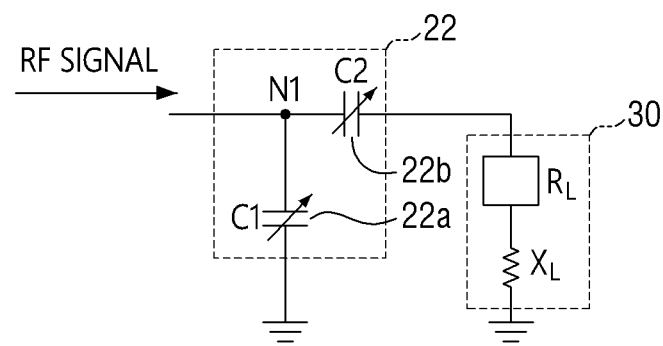
FIG. 3 is a circuit diagram for describing the matching circuit and the non-linear load of FIG. 1.

FIG. 1 is a block diagram illustrating an apparatus for multi-level pulsing according to an embodiment of the present disclosure. FIG. 2 is a view for describing an RF signal generated by the RF signal generator of FIG. 1. FIG. 3 is a circuit diagram for describing the matching circuit and the non-linear load of FIG. 1.

Referring first to FIG. 1, an apparatus 1 for multi-level pulsing according to an embodiment of the present disclosure includes an RF signal generator 10, a matching network 20, a non-linear load 30, and the like.

The RF signal generator 10 generates an RF signal comprising multiple pulsing levels. Referring to FIG. 2(a), the RF signal may include a first pulsing level PL1 and a second pulsing level PL2 that are different from each other. For example, the first pulsing level PL1 may be greater than the second pulsing level PL2. Alternatively, referring to FIG. 2(b), the RF signal may include a plurality of different pulsing levels PL11, PL12, PL13, and PL14. As shown, the plurality of pulsing levels PL11, PL12, PL13, and PL14 may sequentially decrease. Alternatively, referring to FIG. 2(c), the RF signal may include a plurality of different pulsing levels PL21, PL22, and PL23. As illustrated, the plurality of pulsing levels PL21, PL22, and PL23 may sequentially increase. Unlike the one shown in FIG. 2, the RF signal may include five or more pulsing levels, and may not sequentially increase/decrease. Hereinafter, a case, in which the RF signal includes two different first pulsing levels PL1 and second pulsing levels PL2, will be mainly described (see FIG. 2(a)).

The RF signal generator 10 may include a processor 12, a power generator 14, an impedance modulator 16, a frequency modulator 18, and a sensor 19.

The power generator 14 generates power of the RF signal so that the RF signal has different pulsing levels PL1 and PL2.

The impedance modulator 16 adjusts the target impedance of the RF signal. The impedance modulator 16 may adjust the target impedance differently according to the pulsing levels PL1 and PL2 of the RF signal. For example, when the RF signal includes a first pulsing level PL1 and a second pulsing level PL2, the impedance modulator 16 adjusts so that a first target impedance corresponding to the first pulsing level PL1 and the second target impedance corresponding to the second pulsing level PL2 are different from each other. Here, the first target impedance may be a preset value, and the second target impedance may be a value adjusted according to the second load impedance of the load corresponding to the second pulsing level PL2.

The frequency modulator 18 adjusts the frequency of the RF signal. The frequency modulator 18 may adjust the frequency differently according to the pulsing levels PL1 and PL2 of the RF signal. For example, assuming that the RF signal includes a first pulsing level PL1 and a second pulsing level PL2, the frequency modulator 18 adjusts so that a first frequency corresponding to the first pulsing level PL1 and a second frequency corresponding to the second pulsing levels PL2 are different from each other. Here, the second frequency may be a value adjusted according to the second load impedance of the load corresponding to the second pulsing level PL2.

In summary, the RF signal of the first pulsing level PL1 has a first frequency and corresponds to the first target impedance, and the first target impedance may be a preset value. On the other hand, the second frequency of the RF signal of the second pulsing level PL2 or the corresponding second target impedance may be adjusted according to the second impedance of the load in order to minimize the reflected power. That is, the RF signal generator 10 that generates an RF signal having a plurality of pulsing levels PL1 and PL2 may adjust characteristics (particularly, target impedance) of the RF signal to minimize reflected power. A detailed description thereof will be described later in detail with reference to FIGS. 4 to 6.

The sensor 19 measures the reflected power. When the impedance matching is matched, the reflected power is small, and when the impedance matching is not matched, the reflected power is large.

The processor 12 controls the power generator 14, the frequency modulator 18, the impedance modulator 16, the sensor 19, and the like.

Meanwhile, the matching network 20 performs an impedance matching operation, and the matching network 20 includes a matching circuit 22, a controller 24, a first sensor 28, a second sensor 29, and the like.

Matching circuit 22 includes a number of tunable components (e.g., variable capacitors 22a, 22b). The matching circuit 22 receives the RF signal provided from the RF signal generator 10 and provides an output signal to the load 30. In FIG. 3, as an example of the matching circuit 22, a node N1 receiving an RF signal, a variable capacitor 22a disposed between the node N1 and a ground voltage, and a variable capacitor 22b disposed between a node N1 and a non-linear load 30 are included. FIG. 3 illustrates that the matching circuit 22 includes only two variable capacitors 22a and 22b, but the present invention is not limited thereto. For example, the matching circuit 22 may include three or more variable capacitors or further include an inductor.

The first sensor 28 measures the impedance of the load 30 associated with the RF signal generated by the RF signal generator 10. The complex expression of the load impedance $Z_L$ may be $Z_L=R_L+jX_L$ ($R_L$ corresponds to the load resistance, XL corresponds to the load reactance, and $J^2=-1$). The load resistance $R_L$ and the load reactance XL can be known by the first sensor 28.

The second sensor 29 may measure a characteristic (e.g., target impedance) of the RF signal generated by the RF signal generator 10. Additionally, the second sensor 29 may further measure another characteristic of the RF signal (e.g., at least one of power magnitude and frequency).

The controller 24 controls the operating parameters (i.e., C1, C2) of the components (i.e., variable capacitors 22a, 22b) based on the sensed values of the first sensor 28 (i.e., load impedance (load resistance $R_L$ and load reactance XL)) and the sensed values of the second sensor 29 (i.e., power magnitude, frequency, and target impedance, etc.). More specifically, the controller 24 adjusts the operating parameters C1, C2 of the components 22a, 22b for impedance matching with respect to the first pulsing level PL1, and may not perform the adjustment of the operating parameters C1 and C2 of the components 22a and 22b with respect to the second pulsing level PL2.

In summary, when the RF signal of the first pulsing level PL1 having the first frequency and the first target impedance is provided to the matching network 20, the first sensor 28 measures the first load impedance, and the second sensor 29 measures a first target impedance, power magnitude, frequency, and the like of the RF signal. Based on this measurement data, the controller 24 adjusts the operating parameters C1, C2 of the tunable components 22a, 22b to minimize the reflected power.

On the other hand, when an RF signal of a second pulsing level PL2 different from the first pulsing level PL1 is input to the matching network 20, the controller 24 does not adjust operating parameters C1, C2 of the components 22a, 22b. That is, the operating parameters C1 and C2 adjusted when the RF signal of the first pulsing level PL1 is provided are maintained as they are. In order to minimize the reflected power, the RF signal generator 10 adjusts the second target impedance of the RF signal of the second pulsing level PL2. Additionally, the RF signal generator 10 also adjusts the second frequency of the RF signal of the second pulsing level PL2. A method of adjusting the second target impedance and/or frequency may be various. For example, if the controller 24 identifies a second target impedance and/or a second frequency capable of minimizing the reflected power based on the sensed values of the first sensor 28 and the second sensor 29, it provides them to the RF signal generator 10 so that the RF signal generator 10 no longer adjusts the second target impedance and/or the second frequency. Alternatively, the controller 24 may provide the sensed values of the first sensor 28 and the second sensor 29 to the processor 12, the processor 12 may calculate the second target impedance and/or the second frequency capable of minimizing the reflected power, and adjust the second target impedance and/or the second frequency of the RF signal according to the calculation result.

Figure 4:
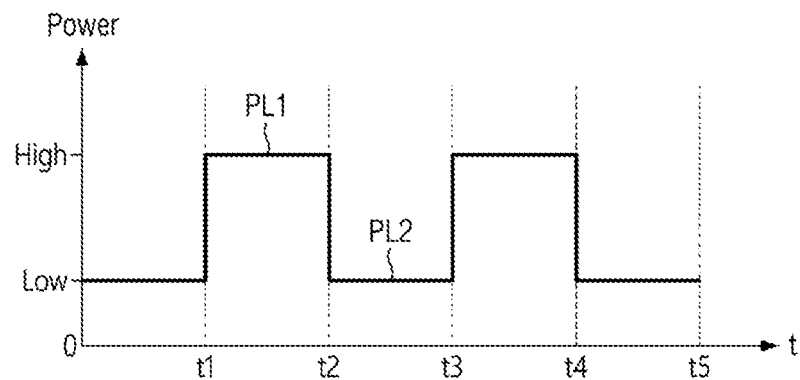
FIG. 4 is an exemplary diagram for describing a relationship between a power magnitude, a frequency, and a target impedance of an RF signal.
Figure 4:
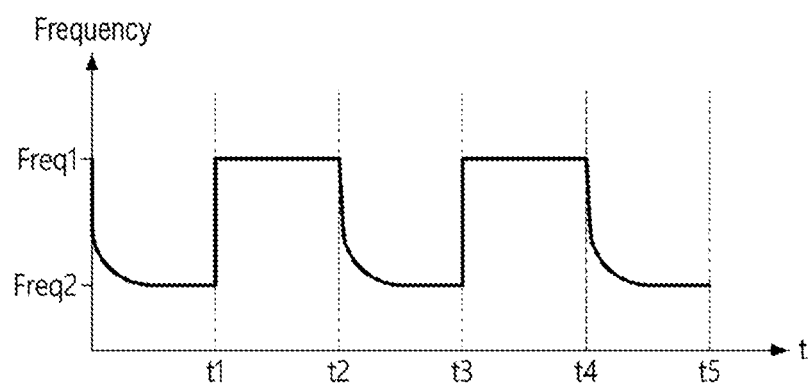
Figure 4:
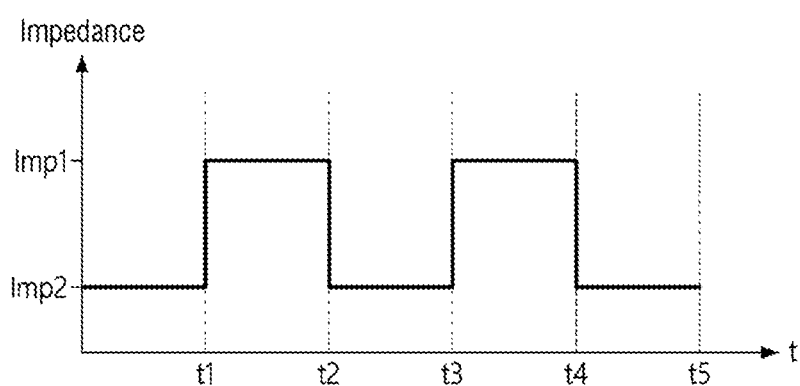

Hereinafter, with reference to FIG. 4, the characteristics of the RF signal generated by the above-described method will be described. FIG. 4 is an exemplary diagram for describing a relationship between a power magnitude, a frequency, and a target impedance of an RF signal.

Referring to FIG. 4, the RF signal includes a first pulsing level PL1 and a second pulsing level PL2 that are different from each other. At times t1 to t2, t3 to t4, the RF signal may be the first pulsing level PL1, and at times 0 to t1, t2 to t3, t4 to t5, the RF signal may be the second pulsing level PL2 smaller than the first pulsing level PL1.

Here, at times t1 to t2, t3 to t4, the frequency of the RF signal may be the first frequency (Freq1), and at times 0 to t1, t2 to t3, t4 to t5, the frequency of the RF signal may be the second frequency (Freq2) smaller than the first frequency (Freq1).

In addition, the target impedance of the RF signal at times t1 to t2, t3 to t4 may be the first target impedance (Imp1), and at times 0 to t1, t2 to t3, t4 to t5, the target impedance of the RF signal may be the second target impedance (Imp2) smaller than the first target impedance (Imp1).

As described above, when the RF signal is the first pulsing level PL1, the first target impedance (Imp1) of the RF signal is a preset value (or fixed value), and is not adjusted in real time for matching with the load impedance. The minimization of the reflected power is achieved through adjustment of the operating parameters C1, C2 of the components 22a, 22b of the matching circuit 22. Adjustment of the first frequency (Freq1) of the RF signal may be additionally performed.

On the other hand, when the RF signal is the second pulsing level PL2, the second frequency (Freq2) and the second target impedance (Imp2) of the RF signal may be adjusted in real time to match the load impedance. The minimization of reflected power is not achieved by adjusting the operating parameters C1, C2 of the components 22a, 22b of the matching circuit 22.

Figure 5:
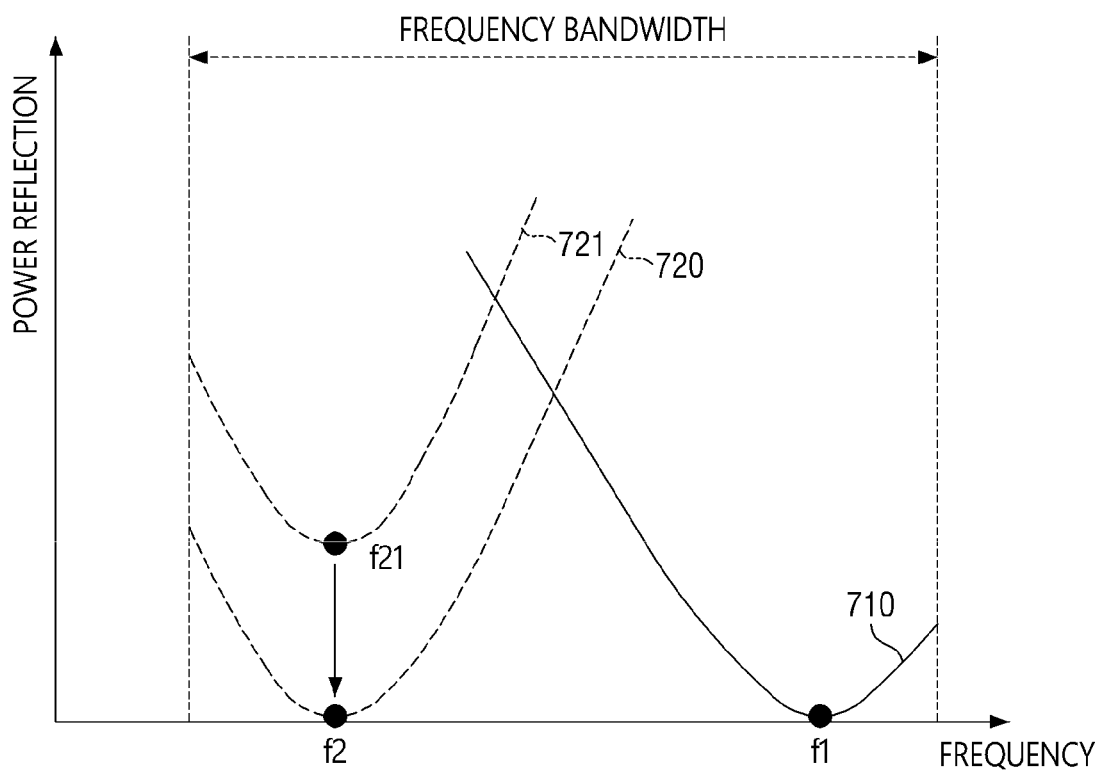
FIG. 5 shows exemplary tuning ranges of the matching circuit of FIG. 1 with respect to multiple pulsing levels.
Figure 6:
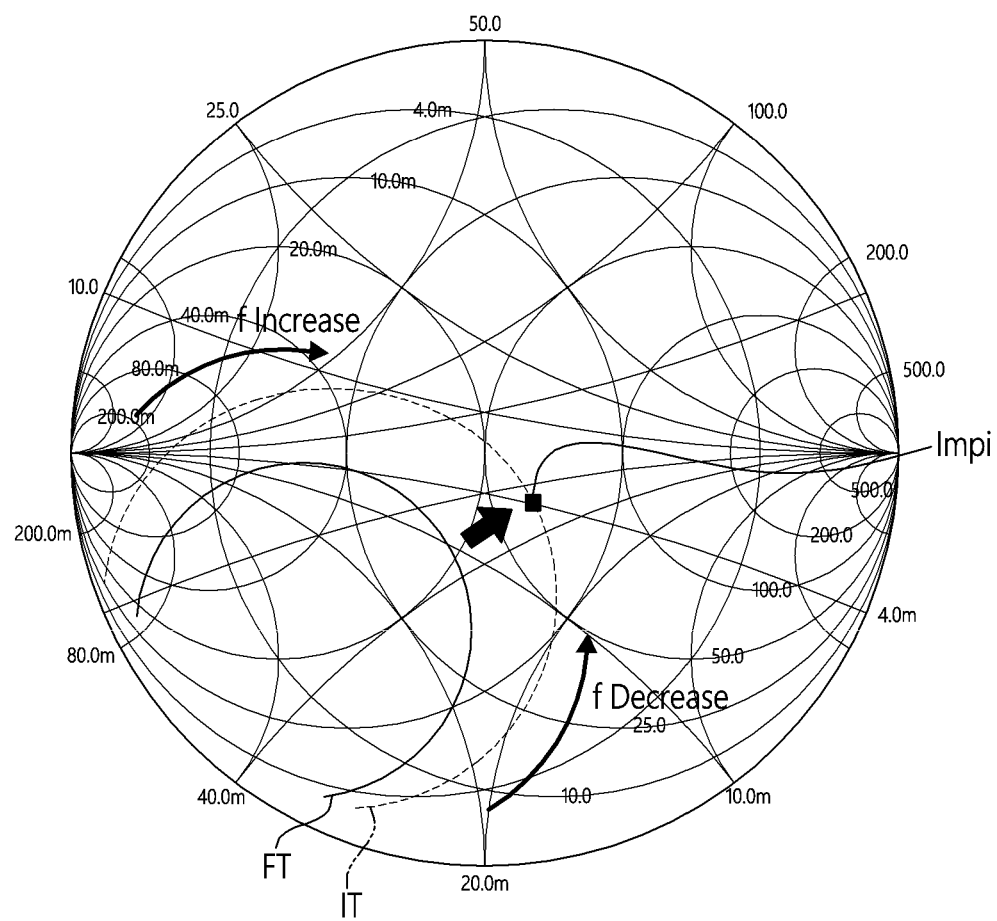
FIG. 6 shows a Smith chart for describing frequency tuning and target impedance tuning.

Hereinafter, FIGS. 5 and 6 are diagrams for describing the effect of an apparatus for multi-level pulsing according to an embodiment of the present disclosure. FIG. 5 shows exemplary tuning ranges of the matching circuit of FIG. 1 with respect to multiple pulsing levels. FIG. 6 shows a Smith chart for describing frequency tuning and target impedance tuning.

First, referring to reference numeral 710 in FIG. 5, when the RF signal is the first pulsing level PL1, the operating parameters C1 and C2 of the components 22a and 22b of the matching circuit 22 are adjusted and/or the frequency of the RF signal is adjusted to minimize power reflection. It can be seen that the power reflection corresponds to zero at frequency f1.

On the other hand, referring to reference numeral 721, when the RF signal is the second pulsing level PL2, even if the operating parameters C1 and C2 of the components 22a and 22b of the matching circuit 22 are adjusted or the frequency of the RF signal is adjusted, it is difficult to minimize the power reflection. It can be seen that the power reflection is not zero even at the frequency f21.

Here, referring to FIG. 6, it is assumed that the area indicated by the small rectangle is the load impedance (Impi) when the RF signal is the second pulsing level PL2. Even if the frequency of the RF signal is adjusted (i.e., frequency tuning), the real part of the impedance (i.e., load resistance $R_L$) is the same, and only the imaginary part of the impedance (i.e., the load reactance XL) changes.

When the RF signal is the second pulsing level PL2, the change of impedance according to the frequency tuning of the RF signal may be made only on the trajectory FT. Even if the frequency of the RF signal is adjusted, the impedance only moves on the trajectory FT and cannot reach the load impedance (Impi). Therefore, even if the frequency tuning is performed, the matching consistency cannot be improved.

On the other hand, referring to reference numeral 720 of FIG. 5, when the RF signal is the second pulsing level PL2, the power reflection can be minimized by adjusting the target impedance corresponding to the RF signal and selectively adjusting the frequency. As shown, it can be seen that the power reflection corresponds to 0 at the frequency f2.

Referring back to FIG. 6, if the target impedance corresponding to the RF signal is adjusted when the RF signal is the second pulsing level PL2, the change of impedance according to the frequency tuning of the RF signal may be made on the trajectory IT (i.e., changed from FT to IT). Accordingly, if the frequency of the RF signal is adjusted, the impedance may move on the trajectory IT to reach the load impedance (Impi). Accordingly, matching consistency can be improved.

Figure 7:
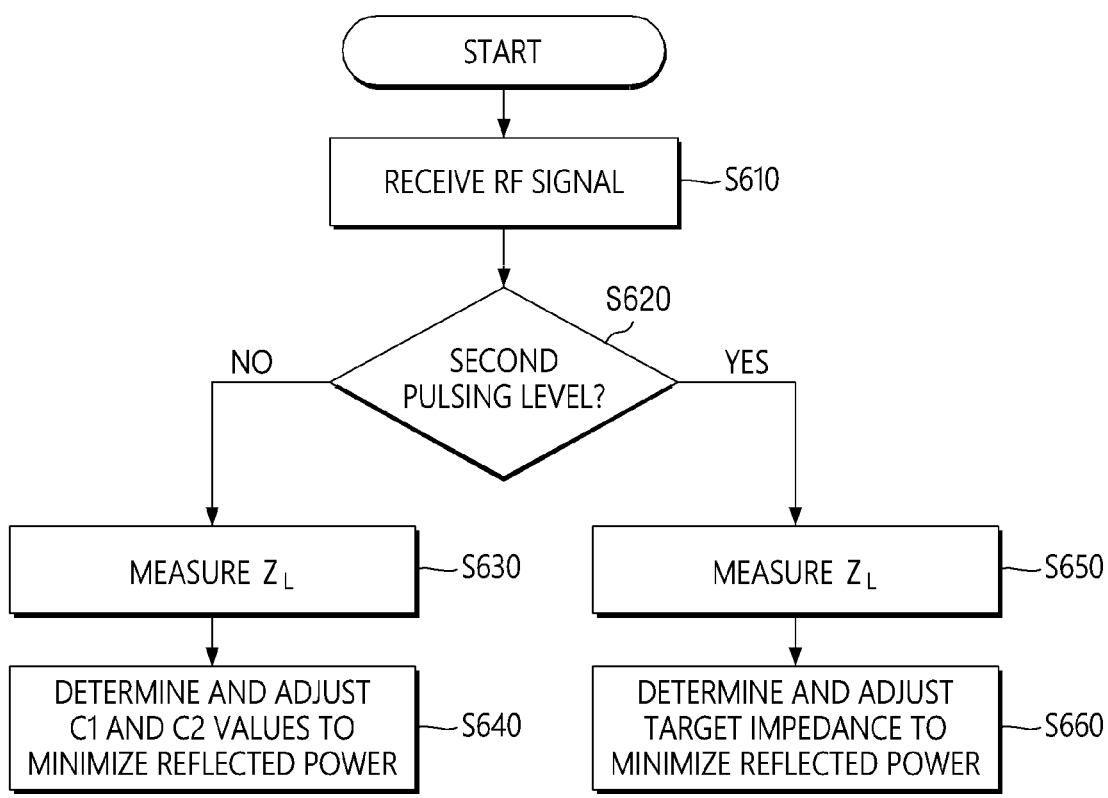
FIG. 7 is a flowchart for describing a method for multi-level pulsing according to an embodiment of the present disclosure.

FIG. 7 is a flowchart illustrating a method for multi-level pulsing according to an embodiment of the present disclosure. For convenience of description, the points different from those described with reference to FIGS. 1 to 6 will be mainly described.

Referring to FIGS. 1 and 7, the matching network 20 receives an RF signal (S610).

A second sensor 29 of the matching network 20 measures a characteristic of the RF signal. As a result of the measurement, it is determined whether the RF signal is the second pulsing level PL2 (S620).

If it is not the second pulsing level PL2 (i.e., the first pulsing level PL1), the first sensor 28 measures the load impedance ZL (S630).

Operating parameters (i.e., C1, C2) of the tunable components (i.e., the variable capacitors 22a, 22b) are determined and adjusted to minimize the reflected power (S640). Specifically, the controller 24 determines and adjusts the operating parameters (i.e., C1, C2) of the components (i.e., variable capacitors 22a, 22b) based on the sensed value of the first sensor 28 (i.e., load impedance (load resistance RL and load reactance XL)) and the sensed value of the second sensor 29 (i.e., power magnitude, frequency and target impedance).

On the other hand, if it is the second pulsing level PL2, the first sensor 28 measures the load impedance ZL (S650).

A target impedance and/or frequency for minimizing the reflected power is determined and adjusted (S660). Specifically, the RF signal generator 10 may adjust the second target impedance and/or the second frequency of the RF signal of the second pulsing level PL2. A method of adjusting the second target impedance and/or frequency may be various. For example, when the controller 24 identifies a second target impedance and/or a second frequency capable of minimizing the reflected power based on the sensed values of the first sensor 28 and the second sensor 29, it provides them to the RF signal generator 10 so that the RF signal generator 10 no longer adjusts the second target impedance and/or the second frequency. Alternatively, the controller 24 may provide the sensed values of the first sensor 28 and the second sensor 29 to the processor 12, and the processor 12 may calculate a second target impedance and/or a second frequency capable of minimizing the reflected power, and the target impedance and/or frequency of the RF signal may be adjusted according to the calculation result.

Assuming that the first pulsing level PL1 and the second pulsing level PL22 are alternately input to the matching network 20, it is operated as follows.

The matching network 20 receives an RF signal of a first pulsing level having a first frequency and a first target impedance. Then, it measures a first load impedance of the load, corresponding to the first pulsing level PL1, and adjusts operating parameters of the tunable components to match the first target impedance and the first load impedance to minimize the reflected power.

Subsequently, an RF signal having a second pulsing level PL2 different from the first pulsing level PL1 is provided. A second load impedance of the load corresponding to the second pulsing level PL2 is measured and the second target impedance and/or the second frequency of the RF signal of the second pulsing level PL2 are adjusted to minimize the reflected power.

Figure 8:
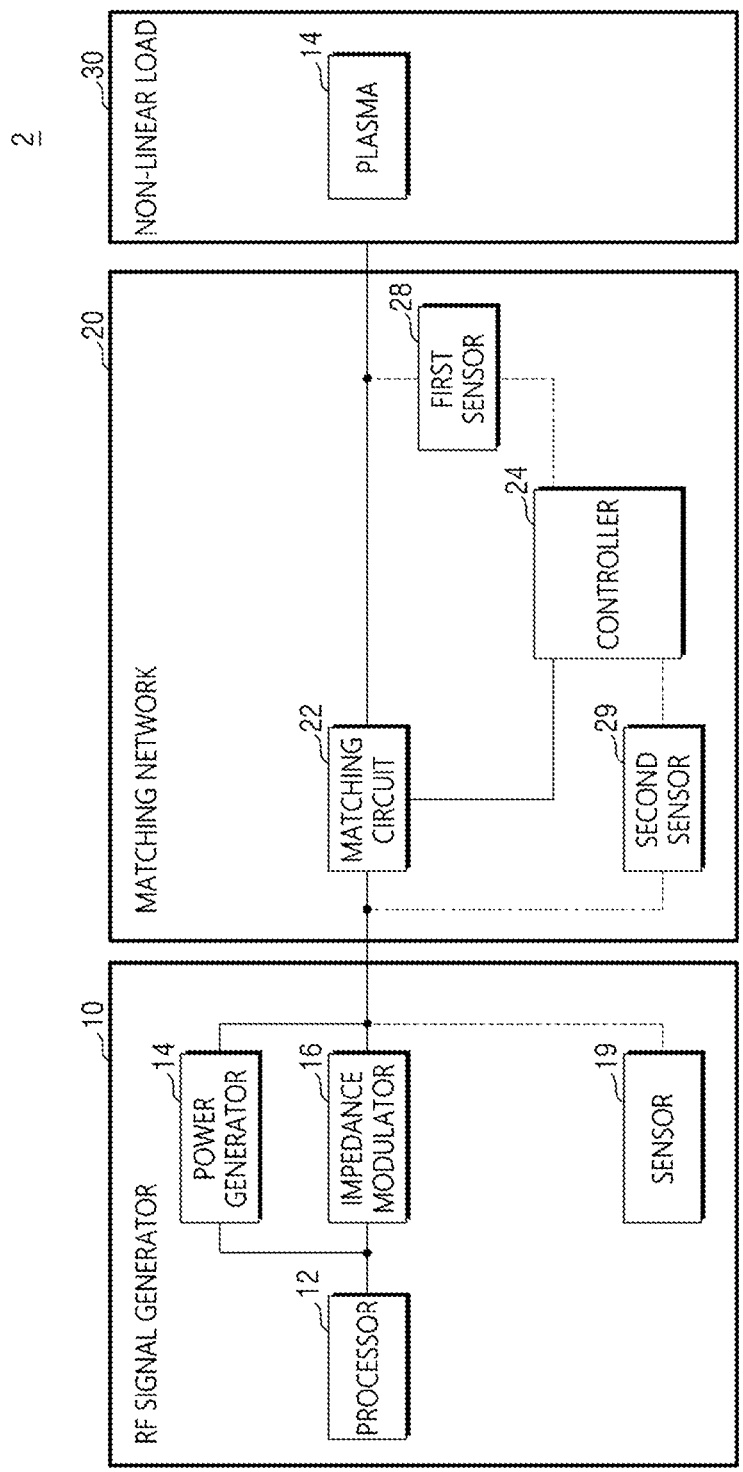
FIG. 8 is a block diagram for describing an apparatus for multi-level pulsing according to another embodiment of the present disclosure.

FIG. 8 is a block diagram illustrating an apparatus for multi-level pulsing according to another embodiment of the present disclosure. For convenience of description, the points different from those described with reference to FIGS. 1 to 7 will be mainly described.

Referring to FIG. 8, in the apparatus 2 for multi-level pulsing according to another embodiment of the present disclosure, the RF signal generator 10 may include a processor 12, a power generator 14, an impedance modulator 16 and a sensor 19. That is, the RF signal generator 10 may not include a frequency modulator (see 18 of FIG. 1). Accordingly, the RF signal generator 10 generates an RF signal including a first pulsing level and a second pulsing level that are different from each other, and when impedance matching of the first pulsing level is performed, the adjustment of the operating parameters of the matching circuit 22 (e.g., C1, C2) may be used, and when impedance matching of the second pulsing level is performed, the matching circuit 22 may not be used and target impedance tuning may be used.

Figure 9:
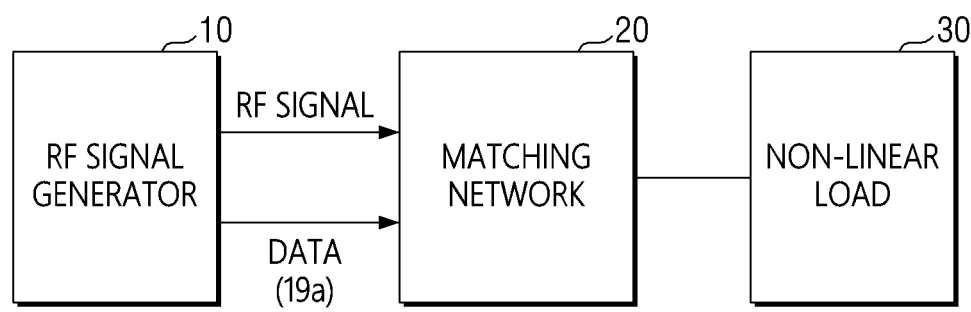
FIG. 9 is a block diagram for describing an apparatus for multi-level pulsing according to another embodiment of the present disclosure.

FIG. 9 is a block diagram for describing an apparatus for multi-level pulsing according to another embodiment of the present disclosure. For convenience of description, the points different from those described with reference to FIGS. 1 to 8 will be mainly described.

Referring to FIG. 9, in the apparatus 3 for multi-level pulsing according to another embodiment of the present disclosure, the RF signal generator 10 may provide data 19a related to RF signal, in addition to providing the RF signal to the matching network 20. The data 19a may be provided in real time. This data 19a may include the power magnitude or frequency of the RF signal.

In the apparatus 1 for multi-level pulsing according to an embodiment of the present invention, the second sensor (see 29 in FIG. 1) of the matching network 20 measures the characteristics of the RF signal (e.g., power magnitude, frequency, etc.), and the controller (see 24 in FIG. 1) reflects the sensed value measured by the second sensor 29 to control the operating parameters (i.e., C1, C2) of the components (i.e., variable capacitors 22a and 22b).

On the other hand, as shown in FIG. 9, when the data 19a related to the RF signal is directly transferred to the matching network 20, the sensing time by the second sensor 29 is unnecessary, and the sensing error by the second sensor 29 does not occur. The controller (see 24 of FIG. 1) may adjust the operating parameters (i.e., C1 and C2) more quickly and accurately based on the received data 19a.

Figure 10:
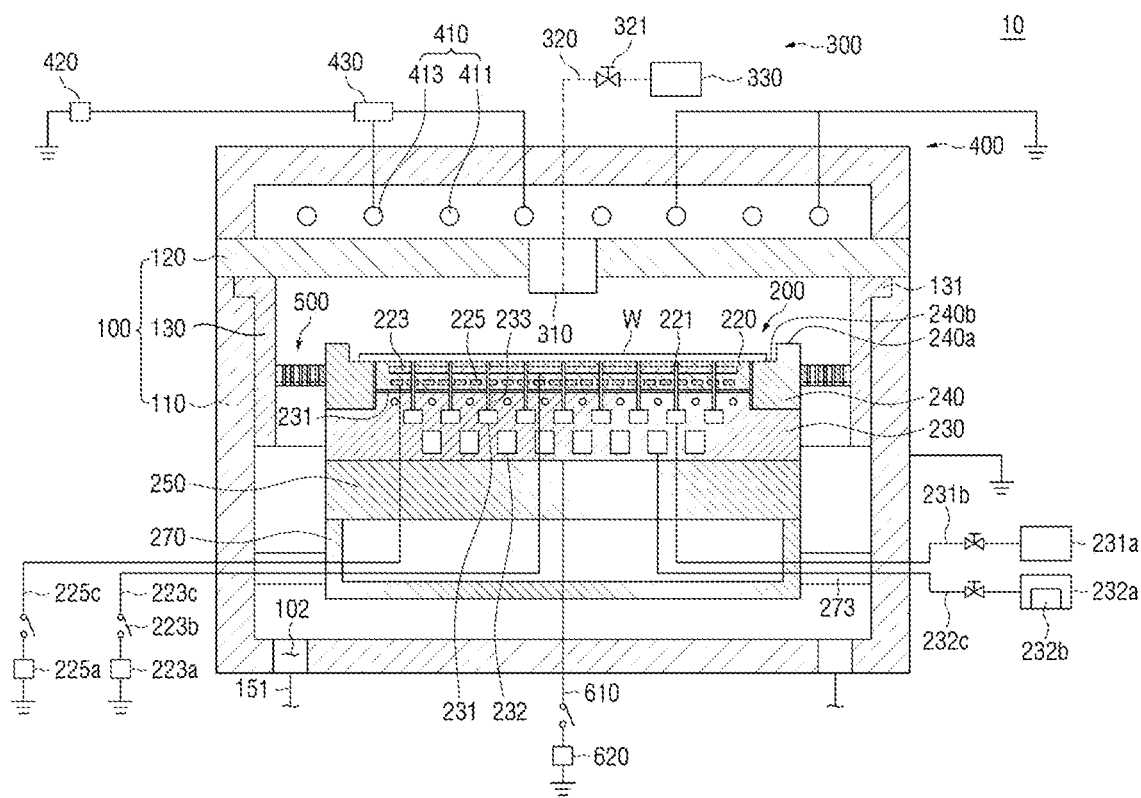
FIG. 10 is an exemplary cross-sectional view for describing a substrate processing apparatus according to some embodiments of the present disclosure.

FIG. 10 is an exemplary cross-sectional view for describing a substrate processing apparatus according to some embodiments of the present disclosure. Although FIG. 10 illustrates an exemplary substrate processing apparatus for generating plasma in an inductively coupled plasma (ICP) method, the present invention is not limited thereto.

Referring to FIG. 10, the substrate processing apparatus 10 according to some embodiments of the present disclosure processes the substrate W using plasma. For example, the substrate processing apparatus 10 may perform an etching process on the substrate W. The substrate processing apparatus 10 may include a process chamber 100, a support unit 200, a gas supply unit 300, a plasma generating unit 400, and a baffle unit 500.

The process chamber 100 provides a space, in which a substrate processing process is performed. The process chamber 100 includes a housing 110, a sealing cover 120, and a liner 130.

The housing 110 has a space with an open upper surface therein. The inner space of the housing 110 is provided as a processing space, in which a substrate processing process is performed. The housing 110 is provided with a metal material. The housing 110 may be provided with an aluminum material. The housing 110 may be grounded. An exhaust hole 102 is formed in the bottom surface of the housing 110. The exhaust hole 102 is connected to the exhaust line 151. Reaction by-products generated during the process and gas remaining in the inner space of the housing may be discharged to the outside through the exhaust line 151. The inside of the housing 110 is decompressed to a predetermined pressure by the exhaust process.

The sealing cover 120 covers the open upper surface of the housing 110. The sealing cover 120 is provided in a plate shape and seals the inner space of the housing 110. The sealing cover 120 may include a dielectric substance window.

The liner 130 is provided inside the housing 110. The liner 130 is formed in a space with open upper and lower surfaces. The liner 130 may be provided in a cylindrical shape. The liner 130 may have a radius corresponding to the inner surface of the housing 110. The liner 130 is provided along the inner surface of the housing 110. A support ring 131 is formed on the upper end of the liner 130. The support ring 131 is provided as a ring-shaped plate, and protrudes to the outside of the liner 130 along the circumference of the liner 130. The support ring 131 is placed on the upper end of the housing 110 and supports the liner 130. The liner 130 may be provided with the same material as the housing 110. That is, the liner 130 may be provided with an aluminum material. The liner 130 protects the inner surface of the housing 110. An arc discharge may be generated inside the chamber 100 while the process gas is excited. Arc discharge damages peripheral devices. The liner 130 protects the inner surface of the housing 110 to prevent the inner surface of the housing 110 from being damaged by arc discharge. In addition, impurities generated during the substrate processing process are prevented from being deposited on the inner wall of the housing 110. The liner 130 has a lower cost than the housing 110 and is easy to replace. Accordingly, when the liner 130 is damaged by arc discharge, an operator may replace the liner 130 with a new one.

The substrate support unit 200 is located inside the housing 110. The substrate support unit 200 supports the substrate W. The substrate support unit 200 may include an electrostatic chuck 210 for adsorbing the substrate W using an electrostatic force. Alternatively, the substrate support unit 200 may support the substrate W in various ways such as mechanical clamping. Hereinafter, the support unit 200 including the electrostatic chuck 210 will be described.

The support unit 200 includes an electrostatic chuck 210, an insulating plate 250, and a lower cover 270. The support unit 200 may be located to be spaced apart from the bottom surface of the housing 110 upwardly in the chamber 100.

The electrostatic chuck 210 includes a dielectric plate 220, a lower electrode 223, a heater 225, a support plate 230, and a focus ring 240.

The dielectric plate 220 is located at an upper end of the electrostatic chuck 210. The dielectric plate 220 is provided as a disk-shaped dielectric substance. A substrate W is placed on the upper surface of the dielectric plate 220. The upper surface of the dielectric plate 220 has a smaller radius than the substrate W. Accordingly, the edge region of the substrate W is located outside the dielectric plate 220. A first supply passage 221 is formed in the dielectric plate 220. The first supply passage 221 is provided from the upper surface to the lower surface of the dielectric plate 210. A plurality of first supply passages 221 are formed to be spaced apart from each other, and are provided as passages, through which the heat transfer medium is supplied to the lower surface of the substrate W.

A lower electrode 223 and a heater 225 are embedded in the dielectric plate 220. The lower electrode 223 is located above the heater 225. The lower electrode 223 is electrically connected to the first lower power supply 223a. The first lower power supply 223a includes a DC power supply. A switch 223b is installed between the lower electrode 223 and the first lower power supply 223a. The lower electrode 223 may be electrically connected to the first lower power supply 223a by turning on/off the switch 223b. When the switch 223b is turned on, a direct current is applied to the lower electrode 223. An electrostatic force acts between the lower electrode 223 and the substrate W by the current applied to the lower electrode 223, and the substrate W is adsorbed to the dielectric plate 220 by the electrostatic force.

The heater 225 is electrically connected to the second lower power supply 225a. The heater 225 generates heat by resisting the current applied from the second lower power supply 225a. The generated heat is transferred to the substrate W through the dielectric plate 220. The substrate W is maintained at a predetermined temperature by the heat generated by the heater 225. The heater 225 includes a spiral-shaped coil.

A support plate 230 is located under the dielectric plate 220. The lower surface of the dielectric plate 220 and the upper surface of the support plate 230 may be adhered by an adhesive 236. The support plate 230 may be provided with an aluminum material. The upper surface of the support plate 230 may be stepped so that the central region is higher than the edge region. The central region of the upper surface of the support plate 230 has an area corresponding to the lower surface of the dielectric plate 220 and is adhered to the lower surface of the dielectric plate 220. A first circulation passage 231, a second circulation passage 232, and a second supply passage 233 are formed in the support plate 230.

The support plate 230 may include a metal plate. The support plate 230 may be connected to the high frequency power supply 620 by the high frequency transmission line 610. The support plate 230 may receive power from the high frequency power supply 620 so that plasma generated in the processing space is smoothly supplied to the substrate. That is, the support plate 230 may function as an electrode. In addition, although the substrate processing apparatus 10 in FIG. 10 is configured as an ICP type, it is not limited thereto, and the substrate processing apparatus 10 according to an embodiment of the present invention may be configured as a CCP type. When the substrate processing apparatus 10 is configured as a CCP type, the high frequency transmission line 610 may be connected to a lower electrode for generating plasma to apply power from the high frequency power supply 620 to the lower electrode.

The first circulation passage 231 is provided as a passage, through which the heat transfer medium circulates. The first circulation passage 231 may be formed in a spiral shape inside the support plate 230. Alternatively, the first circulation passage 231 may be arranged such that ring-shaped passages having different radii have the same center. Each of the first circulation passages 231 may communicate with each other. The first circulation passage 231 is formed at the same height.

The second circulation passage 232 is provided as a passage through which the cooling fluid circulates. The second circulation passage 232 may be formed in a spiral shape inside the support plate 230. In addition, the second circulation passages 232 may be arranged so that ring-shaped passages having different radii have the same center. Each of the second circulation passages 232 may communicate with each other. The second circulation passage 232 may have a larger cross-sectional area than the first circulation passage 231. The second circulation passages 232 are formed at the same height. The second circulation passage 232 may be located below the first circulation passage 231.

The second supply passage 233 extends upwardly from the first circulation passage 231 and is provided on the upper surface of the support plate 230. The second supply passage 243 is provided in a number corresponding to the first supply passage 221 and connects the first circulation passage 231 and the first supply passage 221.

The first circulation passage 231 is connected to the heat transfer medium storage unit 231a through the heat transfer medium supply line 231b. A heat transfer medium is stored in the heat transfer medium storage unit 231a. The heat transfer medium includes an inert gas. According to an embodiment, the heat transfer medium includes helium (He) gas. The helium gas is supplied to the first circulation passage 231 through the supply line 231b, and is supplied to the lower surface of the substrate W sequentially passing through the second supply passage 233 and the first supply passage 221. The helium gas serves as a medium through which heat transferred from the plasma to the substrate W is transferred to the electrostatic chuck 210.

The second circulation passage 232 is connected to the cooling fluid storage unit 232a through the cooling fluid supply line 232c. A cooling fluid is stored in the cooling fluid storage unit 232a. A cooler 232b may be provided in the cooling fluid storage unit 232a. The cooler 232b cools the cooling fluid to a predetermined temperature. Alternatively, the cooler 232b may be installed on the cooling fluid supply line 232c. The cooling fluid supplied to the second circulation passage 232 through the cooling fluid supply line 232c circulates along the second circulation passage 232 to cool the support plate 230. The support plate 230 cools the dielectric plate 220 and the substrate W together while being cooled to maintain the substrate W at a predetermined temperature.

The focus ring 240 is disposed on an edge region of the electrostatic chuck 210. The focus ring 240 has a ring shape and is disposed along the circumference of the dielectric plate 220. The upper surface of the focus ring 240 may be stepped such that the outer portion 240a is higher than the inner portion 240b. The inner portion 240b of the upper surface of the focus ring 240 is located at the same height as the upper surface of the dielectric plate 220. The upper inner portion 240b of the focus ring 240 supports an edge region of the substrate W located outside the dielectric plate 220. The outer portion 240a of the focus ring 240 is provided to surround the edge region of the substrate W. The focus ring 240 allows plasma to be concentrated in a region facing the substrate W in the chamber 10.

An insulating plate 250 is located under the support plate 230. The insulating plate 250 is provided with a cross-sectional area corresponding to the support plate 230. The insulating plate 250 is located between the support plate 230 and the lower cover 270. The insulating plate 250 is provided with an insulating material and electrically insulates the support plate 230 and the lower cover 270.

The lower cover 270 is located at the lower end of the substrate support unit 200. The lower cover 270 is located to be spaced apart from the bottom surface of the housing 110 upwardly. The lower cover 270 has a space with an open upper surface therein. The upper surface of the lower cover 270 is covered by the insulating plate 250. Accordingly, the outer radius of the cross-section of the lower cover 270 may be the same length as the outer radius of the insulating plate 250. A lift pin module (not shown) for moving the transferred substrate W from an external transfer member to the electrostatic chuck 210 may be located in the inner space of the lower cover 270.

The lower cover 270 has a connecting member 273. The connecting member 273 connects the outer surface of the lower cover 270 and the inner wall of the housing 110. A plurality of connecting members 273 may be provided on the outer surface of the lower cover 270 at regular intervals. The connecting member 273 supports the substrate support unit 200 in the chamber 100. In addition, the connecting member 273 is connected to the inner wall of the housing 110 so that the lower cover 270 is electrically grounded. A first power line 223c connected to the first lower power supply 223a, a second power line 225c connected to the second lower power supply 225a, a heat transfer medium supply line 231b connected to the heat transfer medium storage unit 231a, and a cooling fluid supply line 232c connected to the cooling fluid storage unit 232a extend into the lower cover 270 through the inner space of the connecting member 273.

The gas supply unit 300 supplies a process gas into the chamber 100. The gas supply unit 300 includes a gas supply nozzle 310, a gas supply line 320, and a gas storage unit 330. The gas supply nozzle 310 is installed in the central portion of the sealing cover 120. An injection hole is formed on the lower surface of the gas supply nozzle 310. The injection hole is located under the sealing cover 12, and supplies a process gas to the processing space inside the chamber 100. The gas supply line 320 connects the gas supply nozzle 310 and the gas storage unit 330. The gas supply line 320 supplies the process gas stored in the gas storage unit 330 to the gas supply nozzle 310. A valve 321 is installed in the gas supply line 320. The valve 321 opens and closes the gas supply line 320 and controls the flow rate of the process gas supplied through the gas supply line 320.

The plasma generating unit 400 excites the process gas in the chamber 100 into a plasma state. According to an embodiment of the present invention, the plasma generating unit 400 may be configured as an ICP type.

The plasma generating unit 400 may include a high frequency power supply device 420, a first antenna 411, a second antenna 413, and a power distributor 430. The high frequency power supply device 420 supplies a high frequency signal (i.e., an RF signal). The high frequency power supply device 420 may include the RF signal generator 10 and the matching network 20 described with reference to FIGS. 1 to 9.

The first antenna 411 and the second antenna 413 are connected in series with the high frequency power supply device 420. Each of the first antenna 411 and the second antenna 413 may be provided as a coil wound with a plurality of times. The first antenna 411 and the second antenna 413 are electrically connected to the high frequency power supply device 420 to receive RF power. The power distributor 430 distributes the power supplied from the high frequency power supply device 420 to the first antenna 411 and the second antenna 413.

The first antenna 411 and the second antenna 413 may be disposed at positions facing the substrate W. For example, the first antenna 411 and the second antenna 413 may be installed above the process chamber 100. The first antenna 411 and the second antenna 413 may be provided in a ring shape. In this case, the radius of the first antenna 411 may be smaller than the radius of the second antenna 413. Also, the first antenna 411 may be located inside the upper portion of the process chamber 100, and the second antenna 413 may be located outside the upper portion of the process chamber 100.

In some embodiments, the first and second antennas 411 and 413 may be disposed on the side portion of the process chamber 100. According to an embodiment, any one of the first and second antennas 411 and 413 may be disposed above the process chamber 100, and the other may be disposed on the side portion of the process chamber 100. As long as the plurality of antennas generate plasma within the process chamber 100, the position of the coil is not limited.

The first antenna 411 and the second antenna 413 may receive RF power from the high frequency power supply device 420 to induce a time-varying electromagnetic field in the chamber, and accordingly, the process gas supplied to the process chamber 100 may be excited to plasma.

The baffle unit 500 is located between the inner wall of the housing 110 and the substrate support unit 200. The baffle unit 500 includes a baffle, in which a through hole is formed. The baffle is provided in the shape of an annular ring. The process gas provided in the housing 110 passes through the through holes of the baffle and is exhausted to the exhaust hole 102. The flow of the process gas may be controlled according to the shape of the baffle and the shape of the through holes.

Although embodiments of the present invention have been described with reference to the above and the accompanying drawings, it could be understood that those of ordinary skill in the art to which the present invention pertains can practice the present invention in other specific forms without changing its technical spirit or essential features. Therefore, it should be understood that the embodiments described above are illustrative in all respects and not limiting.

What is claimed is:

1. An apparatus for multi-level pulsing comprising:
   an RF signal generator for generating an RF signal including a first pulsing level and a second pulsing level that are different from each other; and
   a matching network for receiving the RF signal and providing a corresponding output signal to a load,
   wherein the RF signal generator generates an RF signal so that a first target impedance of the first pulsing level and a second target impedance of the second pulsing level are different from each other,
   wherein the matching network includes at least one tunable component,
   wherein in order to reduce reflected power associated with the RF signal of the first pulsing level, the first target impedance in the RF signal generator is not adjusted, and operating parameters of the at least one tunable component of the matching network are adjusted,
   wherein in order to reduce reflected power associated with the RF signal of the second pulsing level, the operating parameters of the tunable component of the matching network are not adjusted, and the second target impedance in the RF signal generator is adjusted.

2. The apparatus of claim 1, wherein the first target impedance is a preset value,
   wherein the second target impedance is adjusted by the RF signal generator according to a second load impedance of the load corresponding to the second pulsing level.

3. The apparatus of claim 1, wherein the RF signal generator generates the RF signal so that a first frequency of the first pulsing level and a second frequency of the second pulsing level are different from each other.

4. The apparatus of claim 1, wherein the second frequency is adjusted according to a second load impedance of the load corresponding to the second pulsing level.

5. The apparatus of claim 1, wherein the RF signal generator transfers a power magnitude or frequency of the RF signal to the matching network in real time.

6. The apparatus of claim 1, wherein the RF signal generator comprises,
   a power generator for generating power of the RF signal,
   a frequency modulator for adjusting a frequency of the RF signal,
   an impedance modulator for adjusting a second target impedance of the RF signal, and
   a processor for controlling the power generator, the frequency modulator, and the impedance modulator.

7. The apparatus of claim 1, wherein the matching network comprises,
   a matching circuit including tunable components,
   a first sensor for detecting an impedance of the load,
   a second sensor for measuring at least one of a first target impedance and a second target impedance of the RF signal, and
   a controller for controlling operating parameters of the components based on sensed values of the first sensor and the second sensor.

8. The apparatus of claim 1, wherein the second sensor further measures at least one of a power magnitude and a frequency of the RF signal.

9. An apparatus for processing a substrate comprising:
   a chamber including a processing space for processing a substrate;
   a support module located in the processing space and for supporting the substrate;
   a gas supply unit for supplying gas to the processing space; and
   a plasma generating unit for exciting gas in the processing space into a plasma state,
   wherein the plasma generating unit comprises,
   an RF signal generator for generating an RF signal, and
   a matching network for receiving the RF signal and providing a corresponding output signal to a load,
   wherein the RF signal generator generates the RF signal so that a first target impedance of a first pulsing level and a second target impedance of a second pulsing level are different from each other, wherein the matching network includes at least one tunable component, wherein in order to reduce reflected power associated with the RF signal of the first pulsing level, the first target impedance in the RF signal generator is not adjusted, and operating parameters of the at least one tunable component of the matching network are adjusted, wherein in order to reduce reflected power associated with the RF signal of the second pulsing level, the operating parameters of the tunable component of the matching network are not adjusted, and the second target impedance in the RF signal generator is adjusted.

10. The apparatus of claim 9, wherein the RF signal generator generates the RF signal so that a first frequency of the first pulsing level and a second frequency of the second pulsing level are different from each other.

11. The apparatus of claim 10, wherein the second target impedance and the second frequency are adjusted by the RF signal generator according to a second load impedance of the load corresponding to the second pulsing level.

12. The apparatus of claim 9, wherein the RF signal generator comprises,
   a power generator for generating power of the RF signal,
   a frequency modulator for adjusting a frequency of the RF signal,
   an impedance modulator for adjusting a second target impedance of the RF signal, and
   a processor for controlling the power generator, the frequency modulator, and the impedance modulator.

13. The apparatus of claim 9, wherein the matching network comprises,
   a matching circuit including tunable components,
   a first sensor for detecting an impedance of the load,
   a second sensor for measuring at least one of a first target impedance and a second target impedance of the RF signal, and
   a controller for controlling operating parameters of components based on sensed values of the first sensor and the second sensor.

14. A method for multi-level pulsing comprising:
receiving an RF signal of a first pulsing level having a first frequency and a first target impedance;
measuring a first load impedance of a load corresponding to the first pulsing level;
adjusting operating parameters of tunable components to match the first target impedance and the first load impedance in order to minimize reflected power;
receiving an RF signal of a second pulsing level different from the first pulsing level;
measuring a second load impedance of the load corresponding to the second pulsing level;
in order to reduce reflected power associated with the RF signal of the first pulsing level, adjusting operating parameters of at least one tunable component of a matching network, and not adjusting the first target impedance of the RF signal, and
in order to reduce reflected power associated with the RF signal of the second pulsing level, adjusting a second target impedance of the RF signal, and not adjusting the operating parameters of the tunable component of the matching network.

15. The method of claim 14 further comprises,
adjusting a frequency of the RF signal of the second pulsing level in order to minimize reflected power.

16. The method of claim 14, wherein adjustment of operating parameters of the components are not performed with respect to the second pulsing level.

* * * * *